(12) United States Patent
Akaike et al.

(10) Patent No.: US 8,648,625 B2
(45) Date of Patent: Feb. 11, 2014

(54) FREQUENCY SYNTHESIZER

(75) Inventors: Kazuo Akaike, Sayama (JP); Nobuo Tsukamoto, Akishima (JP); Tsukasa Kobata, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 538 days.

(21) Appl. No.: 12/807,982

(22) Filed: Sep. 16, 2010

(65) Prior Publication Data

US 2011/0074475 A1 Mar. 31, 2011

(30) Foreign Application Priority Data

Sep. 30, 2009 (JP) .................................. 2009-228328

(51) Int. Cl.
| | |
|---|---|
| *G01R 29/00* | (2006.01) |
| *H03D 3/00* | (2006.01) |
| *H03D 9/00* | (2006.01) |
| *H03B 21/00* | (2006.01) |
| *H03H 11/16* | (2006.01) |
| *H03K 5/13* | (2006.01) |
| *H03K 3/00* | (2006.01) |
| *H03L 5/00* | (2006.01) |

(52) U.S. Cl.
USPC ............... 327/105; 327/2; 327/231; 327/236; 327/244; 327/291; 375/375; 375/376; 331/182

(58) Field of Classification Search
USPC ............ 327/2–12, 105, 291; 331/18, 25, 182; 702/89, 106
See application file for complete search history.

(56) References Cited

U.S. PATENT DOCUMENTS

| 4,387,351 | A | * | 6/1983 | Furiga et al. ................... 332/127 |
| 5,554,987 | A | * | 9/1996 | Ooga ............................. 341/147 |
| 6,603,362 | B2 | * | 8/2003 | Von Dolteren, Jr. ............ 331/25 |
| 2009/0195281 | A1 | * | 8/2009 | Tamura et al. ................. 327/163 |

FOREIGN PATENT DOCUMENTS

JP 2007-074291 3/2007

* cited by examiner

*Primary Examiner* — Lincoln Donovan
*Assistant Examiner* — Colleen O Toole
(74) *Attorney, Agent, or Firm* — Jordan and Hamburg LLP (57) ABSTRACT

There is provided a frequency synthesizer capable of improving phase noise. A sinusoidal signal with a frequency set by a frequency setting part is output as a digital signal from a set signal output part, and the digital signal is D/A-converted. A difference between a sinusoidal signal with a frequency corresponding to an output frequency of a voltage controlled oscillating part and a sinusoidal signal output from a D/A converting part is amplified by a differential amplifier, and an amplified signal is input via an A/D converting part to a means for extracting a phase difference between the aforesaid sinusoidal signals. A voltage corresponding to a signal being the result of integration of the phase difference is input as a control voltage to the voltage controlled oscillating part. Then, a gain of the differential amplifier is set larger than a maximum value of phase noise degradation of the A/D converting part, whereby the phase noise degradation of the A/D converting part is cancelled.

2 Claims, 5 Drawing Sheets

FREQUENCY SYNTHESIZER

BACKGROUND OF THE INVENTION

1. Field of the Invention

The present invention relates to a frequency synthesizer.

2. Description of the Related Art

As a frequency synthesizer, there has been known one that A/D-converts (analog/digital-converts) an output signal of a voltage controlled oscillator, processes an obtained digital signal, and inputs the processing result to the voltage controlled oscillator, thereby forming a PLL (Phase Locked Loop). For example, a patent document 1 describes a frequency synthesizer that A/D-converts (analog/digital-converts) an output signal of a voltage controlled oscillator, quadrature-detects a sinusoidal signal generated from the resultant digital signal, extracts a rotation vector rotating at a difference frequency between the sinusoidal signal and a sinusoidal signal used in the detection, integrates a difference velocity between this rotation vector and a rotation vector rotating in reverse to the rotation vector and rotating at a frequency corresponding to a set frequency, and uses the integration result as an input voltage of the voltage controlled oscillator.

However, there is a problem that phase noise occurs in an output of the frequency synthesizer because of the presence of the phase noise in the PLL.

[Patent document 1] Japanese Patent Application Laid-open No. 2007-74291

SUMMARY OF THE INVENTION

The present invention was made under such circumstances and has an object to provide a frequency synthesizer capable of improving phase noise.

The present invention includes:

a voltage controlled oscillating part outputting a frequency signal that is determined according to a control voltage;

a set signal output part outputting, as a digital signal, a sinusoidal signal with a frequency set by a frequency setting part;

a digital/analog converting part digital/analog-converting the digital signal output from the set signal output part;

a differential amplifier amplifying a difference between a sinusoidal signal with a frequency corresponding to an output frequency of the voltage controlled oscillating part and the sinusoidal signal from the digital/analog converting part;

an analog/digital converting part analog/digital-converting an output signal of the differential amplifier;

a quadrature detecting part quadrature-detecting a frequency signal obtained by the analog/digital converting part and extracting, from the frequency signal, a phase difference signal corresponding to a phase difference between the both sinusoidal signals input to the differential amplifier;

an integrating part integrating the phase difference signal and supplying a voltage corresponding to an integration value to the voltage controlled oscillating part; and an amplitude adjusting part adjusting an amplitude of the output signal of the digital/analog converting part so as to make amplitudes of the both sinusoidal signals input to the differential amplifier equal to each other.

According to the present invention, the output sinusoidal signal corresponding to the output of the voltage controlled oscillating part and the set sinusoidal signal corresponding to the set frequency output from the frequency setting part are input to the differential amplifier after the control is performed so as to make the amplitudes of the both sinusoidal signals equal to each other, the output of the differential amplifier is converted to a digital signal in the A/D converter, the phase difference between the both sinusoidal signals is extracted by the quadrature detection of the obtained digital signal, the phase difference is integrated, and the resultant is input to the voltage controlled oscillating part. Since the amplitudes of the both sinusoidal signals input to the differential amplifier are thus made equal to each other, it is possible to increase a gain of the differential amplifier. Therefore, by making the gain of the differential amplifier larger than a maximum value of phase noise degradation of the A/D converter on a subsequent stage, phase noise level of the A/D converter is cancelled by an increase in power level by the differential amplifier, and as a result, the phase noise of the frequency synthesizer is improved.

DETAILED DESCRIPTION OF THE PREFERRED EMBODIMENT

Hereinafter, the structure of a frequency synthesizer according to an embodiment will be described with reference to a block diagram shown in FIG. 1. The frequency synthesizer according to this embodiment forms a PLL (Phase Locked Loop) circuit that compares phases of a sinusoidal signal as a feedback signal corresponding to a frequency signal output from a voltage controlled oscillator 11 (hereinafter, referred to as a VCO) and a sinusoidal signal output from a DDS 21 (Direct Digital Synthesizer), integrates a voltage corresponding to a phase difference between frequencies of these sinusoidal signals, and supplies an integration result to an input side of the VCO 11. When a frequency difference between these signals becomes zero, the PLL is locked and an output frequency of the VCO 11 is locked at a set frequency. The DDS 21 corresponds to a set signal output part of the claims.

Figure 1:
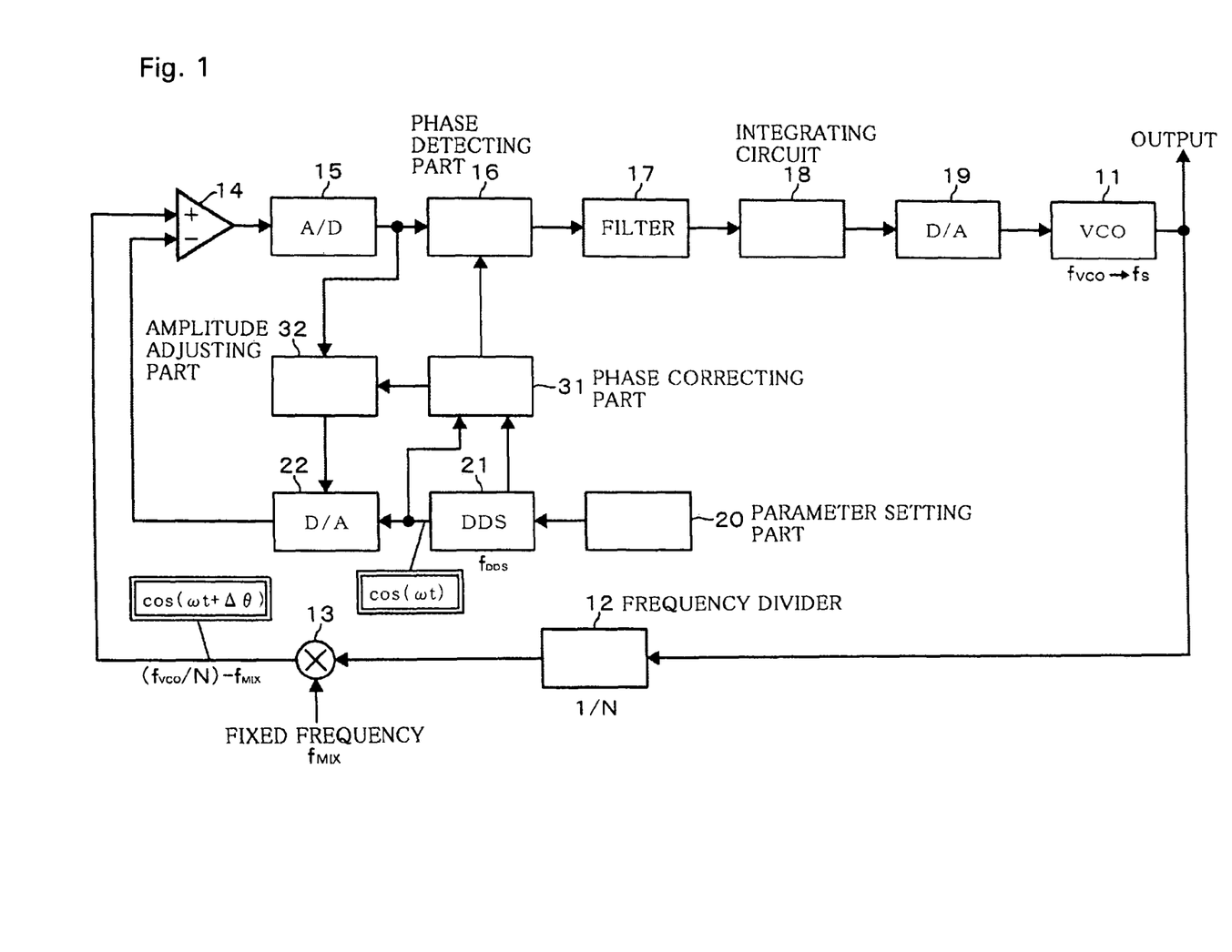
FIG. 1 is a block diagram of a frequency synthesizer according to an embodiment.

In FIG. 1, the VCO 11 plays a role of outputting an analog frequency signal with a frequency $f_{vco}$ that is determined according to a supply voltage. On a subsequent stage of the VCO 11, there is provided a frequency divider 12, which has a function of N-dividing (N is an integer) the frequency of the frequency signal output from the VCO 11 to change the frequency to ($f_{vco}/N$).

A mixer 13 is capable of multiplying the frequency signal output from the frequency divider 12 by a fixed frequency signal with a frequency $f_{MIX}$ and extracting a sinusoidal signal with a low frequency "$(f_{vco}/N)-f_{MIX}$" from a signal with two frequencies "$(f_{vco}/N)\pm f_{MIX}$" obtained based on a heterodyne principle. The sinusoidal signal output from the mixer 13 is input to a differential amplifier 14 on a subsequent stage.

In addition to the sinusoidal signal from the VCO 11 side, a sinusoidal signal for phase comparison with this signal is input to the differential amplifier 14 from the DDS 21 side, and here the DDS 21 will be first described. The DDS 21 has a not-shown waveform table in which, for example, amplitude data of the sinusoidal signal are stored in correspondence to phase data, and has a function of reading the amplitude data based on phase data obtained by cumulative addition of preset phase width data at each input timing of a clock signal output from a not-shown reference clock generator to output the sinusoidal signal with a preset frequency. The reference clock generator is formed by a quartz-crystal oscillator or the like, for instance.

The DDS 21 skips reading waveform data stored in the waveform table according to the magnitude of the phase width data by increasing a value of the phase width data, thereby adjusting the frequency. That is, as the value of the phase width data is made larger, a signal with a higher frequency can be output.

A parameter setting part 20 plays a role of setting the phase width data in order to set the frequency of the sinusoidal signal output from the DDS 21. The parameter setting part 20 corresponds to a frequency setting part in the claims. In this example, a frequency $f_{DDS}$ of the signal output from the DDS 21 is set so that when the frequency signal output from the VCO 11 is locked at the set frequency, the frequency $f_{DDS}$ matches the frequency "$(f_S/N)-(f_{MIX})$" of the signal output from the mixer 13, where $f_S$ is the set frequency of the frequency synthesizer, and based on this value, the phase width data of the parameter setting part 20 is set. In FIG. 1, 22 denotes a D/A converter that converts the digital signal output from the DDS 21 to an analog signal to output the analog signal to the differential amplifier 14. The D/A converter 22 corresponds to a digital/analog converting part in the claims.

The differential amplifier 14 plays a role of calculating a difference value between the sinusoidal signal input from the mixer 13 on the VCO 11 side and the sinusoidal signal input from the DDS 21 side and after amplifying the calculation result, outputting the amplified result to an A/D converter 15 on a subsequent stage.

Here, the reason why the differential amplifier 14 is provided before the phase comparison of the sinusoidal signals will be briefly described. Generally, a frequency signal output from a frequency synthesizer includes phase noise (fluctuation of a frequency with time), and reducing the phase noise is one means to enhance performance of the frequency synthesizer. Therefore, the present inventors analyzed a frequency synthesizer and as a result found out that phase noise degradation which means that phase noise larger than phase noise of a sampling clock occurs in, for example, an A/D converter converting an analog signal from the VCO 11 to a digital signal.

One possible reason why the phase noise degradation occurs in the A/D converter is that noise is mixed in the digital signal when the signal is rounded off to a predetermined number of bits, for example, 14 bits at the time of the sampling of the analog signal to the digital signal. For example, amplifying an input signal to the A/D converter would make it possible to reduce the influence of the rounding processing on a bit end. However, amplifying the input signal requires, for example, a circuit capable of processing a large number of bits, leading to a cost increase of the device.

Therefore, in the frequency synthesizer according to this embodiment, the differential amplifier 14 is provided to calculate a difference between the sinusoidal signals output from both the VCO 11 and the DDS 21 and amplify this difference value, whereby the influence of the rounding processing on the bit end at the time of the sampling of the digital signal is reduced without any increase in the processing bit number. The comparison between a simulation result of an ideal frequency synthesizer free from phase noise degradation in an A/D converter and an output of an actual frequency synthesizer has led the present inventors to the findings that a degradation amount of phase noise in the A/D converter is about 10 dB at the maximum.

Therefore, the differential amplifier 14 according to this embodiment is configured to cancel the phase noise degradation occurring in the A/D converter 15 by amplifying the difference value between the two sinusoidal signals by 10 dB or more, for example, by 26 dB (amplifying 20 times).

Here, for example, the sinusoidal signal output from the DDS 21 can be expressed as $\cos(\omega t)$, where $\omega$ (rad/second) is an angular velocity of the sinusoidal signal, and the sinusoidal signal at an exit of the mixer 13 can be expressed as $\cos(\omega' t)$, where $\omega'$ [rad/second] is an angular velocity of the frequency signal from the VCO 11. In a state immediately before the output frequency $f_{vco}$ of the VCO 11 sufficiently approaches the set frequency $f_S$ and the PLL is locked, since $\omega \approx \omega' = \omega + \Delta\omega (\Delta\omega \ll 1)$, and therefore, the sinusoidal signal at the exit of the mixer 13 can be expressed as $\cos(\omega t + \Delta\omega t)$. Under the condition of $\Delta\omega \ll 1$, a value of $\Delta\omega t$ scarcely changes with time, and thus can be expressed as a phase difference $\Delta\theta$.

That is, in the state immediately before the PLL is locked, the sinusoidal signal input to the differential amplifier 14 from the DDS 21 side can be expressed as $\cos(\omega t)$ and the sinusoidal signal input to the differential amplifier 14 from the mixer 13 can be expressed as $\cos(\omega t + \Delta\theta)$, and a frequency signal expressed by the following expression (1) is output from the differential amplifier 14.

$$20\{\cos(\omega t + \Delta\theta) - \cos(\omega t)\} \qquad (1)$$

The A/D converter 15 provided on a subsequent stage of the differential amplifier 14 plays a role of converting the signal expressed by the above expression (1) to a digital signal, and in the sinusoidal signals output from the mixer 13 on the VCO 11 side and from the D/A converter 22 on the DDS 21 side, time delay occurs while these sinusoidal signals are processed in the differential amplifier 14 and the A/D converter 15. If the time delay is expressed as $\Delta t$ and $t' = t + \Delta t$, the output signal from the A/D converter 15 can be expressed by the following expression (1)'.

$$20\{\cos(\omega t' + \Delta\theta) - \cos(\omega t')\} \qquad (1)'$$

On a subsequent stage of the A/D converter 15, there is provided a phase detecting part 16 being a quadrature detecting part detecting the phase difference $\Delta\theta$ between the two sinusoidal signals, and the phase detecting part 16 has a function of performing a pre-process of multiplying the output signal from the A/D converter 15 on a preceding stage, which is expressed by the expression (1)', by a frequency signal $\sin(\omega t')$ in phase quadrature to $\cos(\omega t')$ included in the above expression (1)' to extract a phase difference component.

Here, the aforesaid DDS 21 is capable of outputting, in parallel, a sinusoidal signal ($\sin(\omega t)$) in phase quadrature to the sinusoidal signal ($\cos(\omega t)$) which is a target of the phase comparison with the output of the mixer 13 on the VCO 11 side. Then, $\sin(\omega t')$ obtained after a phase correcting part 31 phase-corrects this signal by $\Delta t$ is input to the phase detecting part 16. Summarizing the arithmetic operation executed by the phase detecting part 16 gives an output expressed by the following expression (2).

$$\sin(\omega t') \times [20\{\cos(\omega t' + \Delta\theta) - \cos(\omega t')\}] = (20/2)\sin(2\omega t' + \Delta\theta) + (20/2)\sin(-\Delta\theta) + (20/2)\sin(2\omega t') \qquad (2)$$

On a subsequent stage of the phase detecting part 16, a filter 17 is provided, which removes an AC component from the output of the phase detecting part 16, which is expressed by the expression (2), to extract $(20/2)\sin(-\Delta\theta) = -(20/2)\sin(\Delta\theta)$ being a DC component, so that a phase difference between the two sinusoidal signals is known.

An integrating circuit 18, which corresponds to a loop filter of the PLL circuit according to this embodiment, is configured to multiply the signal "$-(20/2)\sin(\Delta\theta)$" corresponding to the phase difference detected by the filter 17 by a coefficient for adjusting a loop gain of the PLL circuit and after dividing the signal into an integration-line value and a direct-line value, adds the both.

Figure 2:
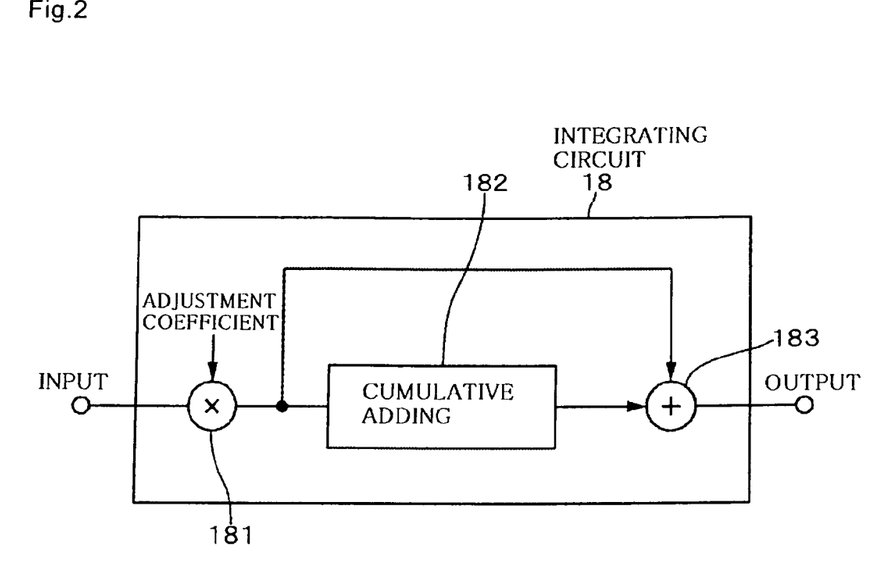
FIG. 2 is a diagram showing the structure of an integrating circuit provided in the frequency synthesizer.

FIG. 2 shows a structure example of the integrating circuit 18, and in FIG. 2, 181 denotes a multiplying part multiplying the input signal by the adjustment coefficient, 182 denotes a cumulative adding part cumulatively adding the signals obtained after the multiplication, and 183 denotes an adding part adding the signal after the multiplication (direct-line value) and the output signal (integration-line value) from the cumulative adding part 182. The integrating circuit 18 plays a role of executing loop control of the PLL circuit so that a value of the input "$-(20/2)\sin(\Delta\theta)$" becomes zero.

On a subsequent stage of the integrating circuit 18, a D/A converter 19 is provided, and the output from the integrating circuit 18 is converted to an analog signal there and the output of the D/A converter 19 is input as a control voltage to the VCO 11, which enables the frequency adjustment by is the PLL circuit.

The frequency synthesizer according to this embodiment described above includes the differential amplifier 14 as described above, and the differential amplifier 14 amplifies the difference value between the sinusoidal signal from the VCO 11 side and the sinusoidal signal from the DDS 21 side, thereby reducing the phase noise degradation occurring in the A/D converter 15 on a subsequent stage. Here, a great difference in signal level between the aforesaid two sinusoidal signals does not allow the sufficient control by the PLL. Therefore, the frequency synthesizer according to this embodiment is configured to be capable of making the amplitudes of the two signals equal to each other by feeding the amplitudes of these two signals back to the DDS 21-side output (D/A converter 22) based on the output signal of the A/D converter 15.

Hereinafter, a mechanism for adjusting the amplitude of the DDS 21-side output will be described. On a subsequent stage of the A/D converter 15, an amplitude adjusting part 32 is connected. The output signal of the A/D converter 15 expressed by the expression (1)' is input to this amplitude adjusting part 32, and the amplitude adjusting part 32 is also connected to the aforesaid phase correcting part 31, so that the signal $\cos(\omega t')$ resulting from the phase correction of the output signal $\cos(\omega t)$ of the DDS 21 is also input to the amplitude adjusting part 32 from the phase correcting part 31.

Here, in view of the amplitude adjustment, the amplitude adjusting part 32 executes the arithmetic operation based on the following expression (3), where $A\cos(\omega t'+\Delta\theta)$ is the output signal from the mixer 13 and $B\cos(\omega t')$ is the output signal from the D/A converter 22 on the DDS 21 side (the both output signals have already undergone the $\Delta t$ phase adjustment).

$$\cos(\omega t') \times \{A\cos(\omega t'+\Delta\theta) - B\cos(\omega t')\} = (A/2)\{\cos(2\omega t'+\Delta\theta) + \cos(\Delta\theta)\} - (B/2)\{(\cos(2\omega t)+1)\} \quad (3)$$

The amplitude adjusting part 32 includes a not-shown low-pass filter, and when the frequency signal with $2\omega t$ in the expression (3) is cut, a signal expressed by the following expression (4) is obtained.

$$(A/2)\{\cos(\Delta\theta)\} - B/2 \quad (4)$$

Here, $\Delta\theta \ll 1$ as described above, and in this case, since the approximation of $\cos(\theta) \approx 1$ is possible, the expression (4) can be written as the following expression (4)'.

$$(A/2) - (2/B) \quad (4)'$$

In view of the amplitude adjustment, the aforesaid D/A converter 22 provided on the subsequent stage of the DDS 21 is configured to be capable of converting the sinusoidal signal input from the DDS 21 to the digital signal and also be capable of amplitude adjustment of the output signal so that the result of the expression (4)' becomes zero.

The operation of the frequency synthesizer having the above-described structure will be described. Set values of the frequency synthesizer are as follows: for example, the set frequency is $f_S=8755.5$ MHz, a frequency divider ratio of the frequency divider 12 is N=104, and the fixed frequency signal of the mixer 13 is $f_{MIX}=80$ MHz. The frequency synthesizer further includes a not-shown frequency pull-in mechanism and is capable of pulling an output frequency of the VCO 11 to a value close to the set frequency at the time of its startup.

When the output frequency of the VCO 11 is pulled to the value close to the set frequency, the PLL circuit shown in FIG. 1 operates. The frequency of the output of the VCO 11 is divided to a $1/104$ frequency by the frequency divider 12, and the mixer 13 multiplies the divided frequency by the fixed frequency 80 MHz to output the resultant to the differential amplifier 14. Here, when $f_{vco}=f_S$, a frequency signal with $8755.5 \times 10^6/104 - 80 \times 10^6 = 4187500$ Hz is output from the mixer 13.

In the DDS 21, the setting is made in advance by the parameter setting part 20 so that the output frequency $f_{DDS}$ becomes the aforesaid 4187500 Hz, and the sinusoidal signal having this output frequency is input to the differential amplifier 14 after being amplitude-adjusted by the D/A converter 22.

In the differential amplifier 14, a difference value between the input value from the mixer 13 and the input value from the DDS 21 side is calculated, the calculation result is amplified by, for example, 10 dB or more, for example, by 26 dB (amplified 20 times), and then input to the A/D converter 15. In the A/D converter 15, the arithmetic operation is performed in which the input frequency data is sampled and is converted to, for example, 14-bit digital data, and the input value to the A/D converter 15 has been amplified by 10 dB or more. As a result, a quantization error is reduced, which can prevent the occurrence of the phase noise degradation.

The output of the AD converter 15 thus obtained is input to the amplitude adjusting part 32 and the phase detecting part 16, and the amplitude adjusting part 32 compares the amplitudes of the sinusoidal signals output from the mixer 13 and the DDS 21, and the feedback to the D/A converter 22 is performed so that these amplitudes match each other. Since the amplitude adjustment is thus performed so that the amplitude of the sinusoidal signal on the DDS 21 side matches the amplitude of the sinusoidal signal on the mixer 13 side, the signal input to the A/D converter 15 does not become excessively large even when the difference value between these signals is amplified by the differential amplifier 14.

The signal input to the phase detecting part 16 is subjected to the arithmetic operation for detecting the phase difference $\Delta\theta$, the signal expressed by the expression (2) is output, and the signal "$-(20/2)\sin(\Delta\theta)$" corresponding to the phase difference is extracted in the filter 17. The signal extracted in the filter 17 is integrated and added in the integrating circuit 18, and after converted to analog data in the D/A converter 19, the resultant is applied as the control voltage to the VCO 11.

The PLL circuit executes the loop control so that "−(20/2) sin(Δθ)"=0", that is, Δθ=0, and as a result, the state is produced where the output frequency $f_{VCO}$ of the VCO 11 in the case of Δθ=0 is locked at the set frequency $f_S$ and the sinusoidal signal output from the mixer 13 is synchronous with the output from the DDS 21.

According to the frequency synthesizer described above, the following effects are obtained. After the control is performed so that the amplitude of the output sinusoidal signal corresponding to the output of the VCO 11 matches the amplitude of the set sinusoidal signal corresponding to the set frequency set by the parameter setting part 20, these sinusoidal signals are input to the differential amplifier 14, and the output therefrom is converted to a digital signal in the A/D converter 15, the phase difference between the both sinusoidal signals is extracted by the quadrature-detection of the obtained digital signal, and the result of the integration of the phase difference is input to the VCO 11. Since the amplitudes of the both sinusoidal signals input to the differential amplifier 14 are thus made equal to each other, it is possible to increase a gain of the differential amplifier 14. Therefore, by making the gain of the differential amplifier 14 larger than the maximum value of the phase noise degradation of the A/D converter 15 on a subsequent stage, the phase noise level of the A/D converter 15 is cancelled by an increase in power level by the differential amplifier 14, so that the phase noise of the frequency synthesizer is improved.

EXAMPLES

Simulation

A model of the frequency synthesizer shown in FIG. 1 was fabricated, and simulations of the level of phase noise were performed regarding a case where the difference value of the sinusoidal signals was amplified in the differential amplifier 14 and a case where the difference value was not amplified. The set frequency was set as $f_S$=8755.5 MHz, the frequency divider ratio of the frequency divider 12 was set as N=104, and the fixed frequency signal of the mixer 13 was set as $f_{MIX}$=80 MHz.

A. Simulation Condition

Example 1

The difference value between the sinusoidal signals was amplified by 26 bB (20 times) in the differential amplifier 14.

Comparative Example 1

The difference value between the sinusoidal signals was not amplified in the differential amplifier 14.

B. Simulation Result

Figure 3:
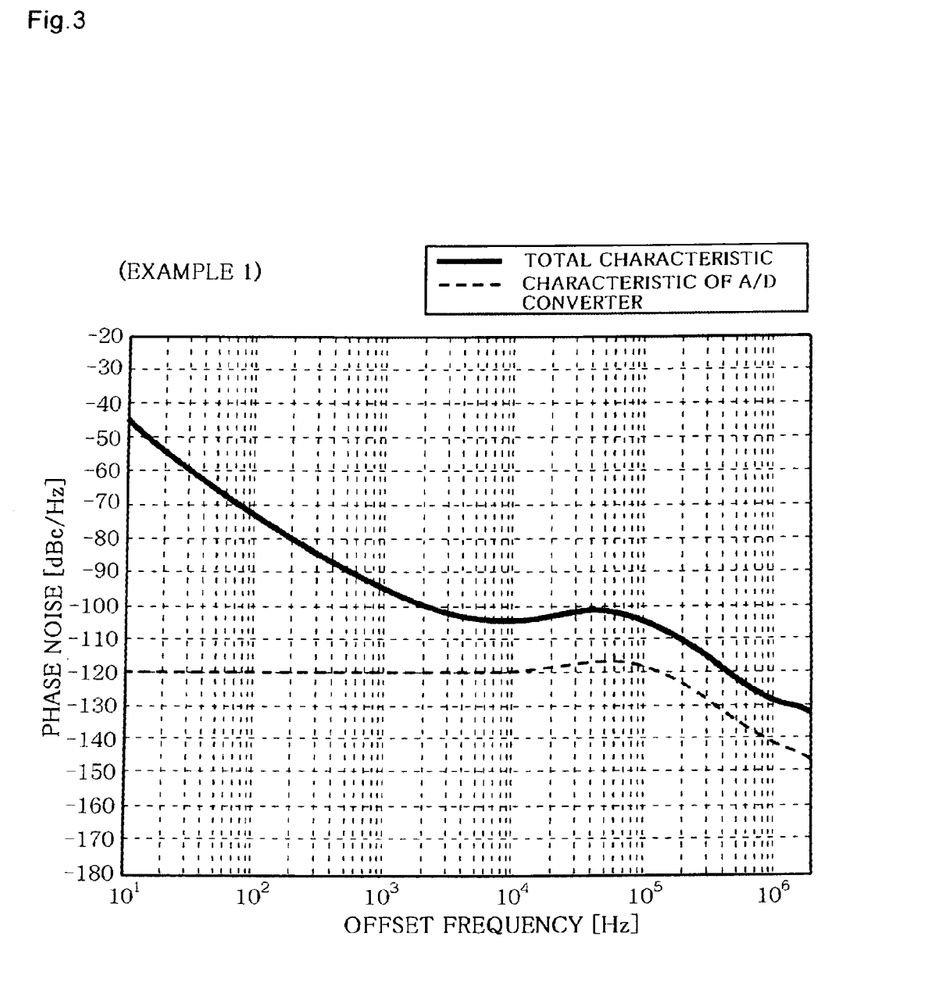
FIG. 3 is an explanatory chart showing a simulation result according to an example.
Figure 4:
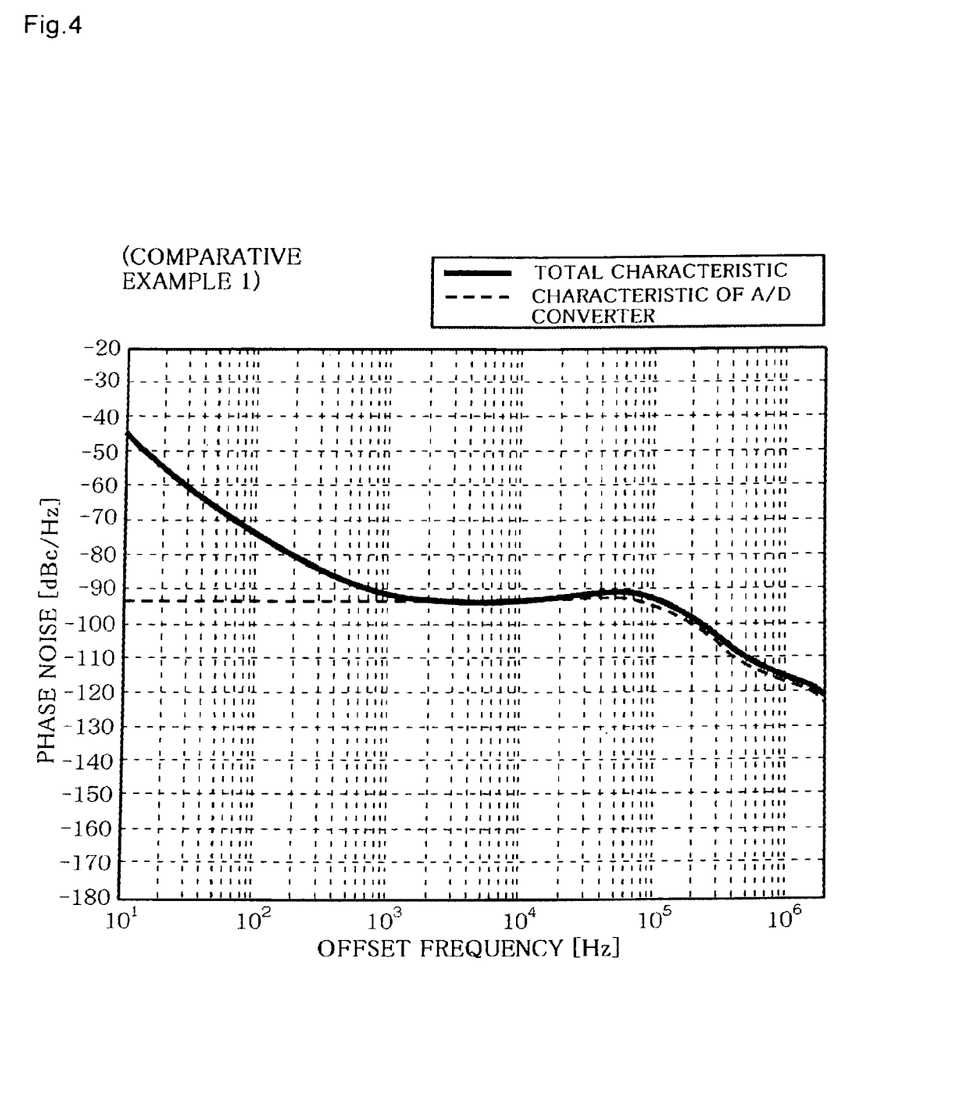
FIG. 4 is an explanatory chart showing a simulation result according to a comparative example.

The result of the simulation of (Example 1) is shown in FIG. 3 and the result of the simulation of (Comparative Example 1) is shown in FIG. 4. The horizontal axis of each graph represents an offset frequency [Hz] indicating a deviation amount from the set frequency in the state where the frequency synthesizer is locked at the set frequency $f_S$, and the vertical axis represents level [dBc/Hz] of phase noise included in the frequency signal output from the frequency synthesizer. In each of the drawings, the solid line represents level of phase noise of the whole frequency synthesizer, and the broken line represents level of phase noise occurring from the A/D converter 15, among phase noises included in the total level.

According to the result of (Example 1) shown in FIG. 3, the level of the phase noise at a position where, for example, the offset frequency is 10 kHz is about −100 dBc/Hz. The level of the phase noise shown by the broken line, that is, the phase noise occurring from the A/D converter 15 is lower than the level of the phase noise of the whole frequency synthesizer. This implies that the phase noise occurring form the A/D converter 15 does not constitute a bottleneck deciding the level of the phase noise of the whole frequency synthesizer, and by reducing the phase noise occurring due to other factors, it is possible to further reduce the total phase noise level.

On the other hand, in (Comparative Example 1) where the difference value was not amplified in the differential amplifier 14, the level of the phase noise at the position where the offset frequency is 10 kHZ is about −90 dBc/Hz as shown in FIG. 4, and thus the phase noise level is larger than that of (Example 1). Further, the level of the phase noise shown by the broken line, that is, occurring from the A/D converter 15 matches the level of the phase noise of the whole frequency synthesizer and thus the phase noise occurring from the A/D converter 15 constitutes a bottleneck deciding the level of the phase noise of the frequency synthesizer. Therefore, there is no room for improving the phase noise level of the whole frequency synthesizer unless the phase noise occurring in the A/D converter 15 is reduced.

From the above simulation results, it is seen that providing the differential amplifier 14 to calculate the difference value between the two sinusoidal signals whose phases are compared and amplify the difference value by 10 dB or more has an effect of improving the phase noise level of the whole frequency synthesizer (reducing the phase noise degradation).

(Experiment)

The frequency synthesizer shown in FIG. 1 was fabricated and the phase noise level was measured.

A. Experiment Condition

Example 2

The frequency synthesizer was operated under the same condition as that of (Example 1), and the phase noise level was measured.

B. Experiment Result

Figure 5:
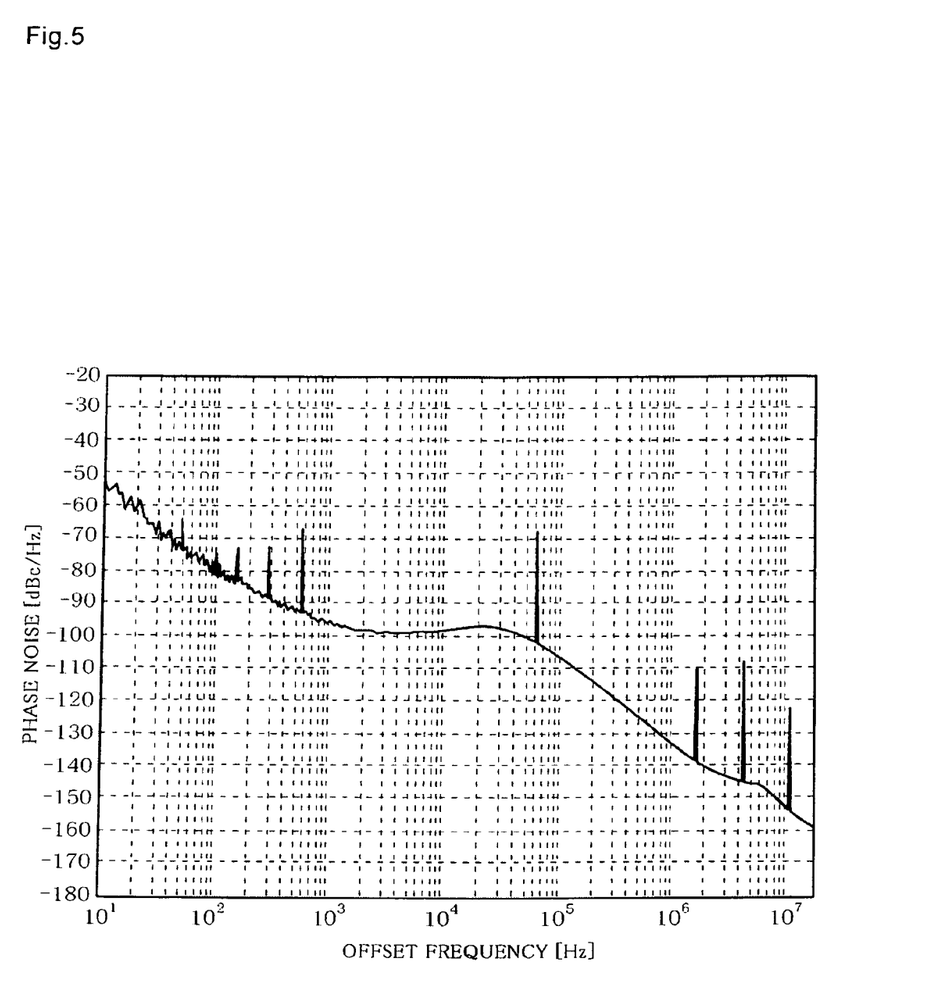
FIG. 5 is an explanatory chart showing an experiment result according to an example.

The result of (Example 2) is shown in FIG. 5. According to the result of (Example 2), the phase noise level observed in the actual frequency synthesizer well matched the simulation result of (Example 1). From this, the effect of improving the phase noise level (effect of reducing the phase noise degradation) by providing the differential amplifier 14 was also actually confirmed.

What is claimed is:
1. A frequency synthesizer comprising:
a voltage controlled oscillating part outputting a frequency signal that is determined according to a control voltage;
a set signal output part outputting, as a digital signal, a sinusoidal signal with a frequency set by a frequency setting part;
a digital/analog converting part digital/analog-converting the digital signal output from said set signal output part;
a differential amplifier amplifying a difference between a sinusoidal signal with a frequency corresponding to an output frequency of said voltage controlled oscillating part and the sinusoidal signal from said digital/analog converting part;

an analog/digital converting part analog/digital-converting an output signal of said differential amplifier;

a phase detecting part quadrature-detecting a frequency signal obtained by said analog/digital converting part and extracting, from the frequency signal, a phase difference signal corresponding to a phase difference between the both sinusoidal signals input to said differential amplifier;

an integrating part integrating the phase difference signal and supplying a voltage corresponding to an integration value to said voltage controlled oscillating part; and an amplitude adjusting part detecting, on a basis of both sinusoidal signals obtained by said differential amplifier, a differential value of amplitudes of said both sinusoidal signals, and on a basis of the differential value of the amplitudes, adjusting an amplitude of the output signal of said digital/analog converting part so as to make amplitudes of the both sinusoidal signals input to said differential amplifier equal to each other.

2. The frequency synthesizer according to claim 1, further comprising a means for generating a signal expressed by sin$[\omega(t+\Delta t)]$, which is a detection signal used for the quadrature detection, where $\Delta t$ is a time delay from an instant when the sinusoidal signal expressed by $\cos(\omega t)$ is output from said set signal output part to an instant when a signal corresponding to the sinusoidal signal is output from said analog/digital converting part.

* * * * *